US010863636B2

United States Patent
Lin et al.

(10) Patent No.: US 10,863,636 B2
(45) Date of Patent: Dec. 8, 2020

(54) METHOD FOR MANUFACTURING ELECTRONIC DEVICE

(71) Applicants: Inventec (Pudong) Technology Corporation, Shanghai (CN); INVENTEC CORPORATION, Taipei (TW)

(72) Inventors: Chun-Chi Lin, Taipei (TW); Ying-Shan Chen, Taipei (TW); I-Fang Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 289 days.

(21) Appl. No.: 16/173,068

(22) Filed: Oct. 29, 2018

(65) Prior Publication Data

US 2019/0254183 A1 Aug. 15, 2019

(30) Foreign Application Priority Data

Feb. 14, 2018 (CN) .......................... 2018 1 0152032

(51) Int. Cl.
| H05K 3/30 | (2006.01) |
| H05K 5/00 | (2006.01) |
| H05K 5/02 | (2006.01) |
| B05D 1/20 | (2006.01) |
| B05D 7/00 | (2006.01) |
| B05D 5/06 | (2006.01) |

(52) U.S. Cl.
CPC ............. *H05K 5/0047* (2013.01); *B05D 1/20* (2013.01); *B05D 7/54* (2013.01); *H05K 5/0204* (2013.01); *H05K 5/0243* (2013.01); *H05K 5/0247* (2013.01); *B05D 5/061* (2013.01)

(58) Field of Classification Search
CPC .. H05K 5/0047; H05K 5/0243; H05K 5/0247; H05K 5/0204; B05D 1/20; B05D 7/54; B05D 5/061; B44C 5/0446; B44C 1/20; B44C 1/228; B44C 1/175; Y10T 29/49126; Y10T 29/4913
USPC .......................................... 29/830, 832, 841
See application file for complete search history.

(56) References Cited

U.S. PATENT DOCUMENTS

| 9,039,264 B2* | 5/2015 | Martini ................. F21S 10/023 |
| | | 362/565 |
| 9,932,133 B2* | 4/2018 | Sherman ................ A44C 15/00 |
| 10,617,023 B2* | 4/2020 | Lin ....................... H05K 7/1427 |

(Continued)

*Primary Examiner* — Donghai D Nguyen
(74) *Attorney, Agent, or Firm* — Locke Lord LLP; Tim Tingkang Xia, Esq.

(57) ABSTRACT

A method for manufacturing an electronic device is disclosed. In the method, a first shell and a second shell are formed. The first shell and the second shell are assembled with each other to form a casing for receiving an electronic module. The two opposite ends of the casing respectively have a first opening and a second opening. The first opening and the second opening are aligned with each other along an extending direction. A seam is located at an outer surface of the casing and between the first shell and the second shell. A paint level is formed on the outer surface of the casing to cover the seam. The casing is moved toward a water transferring film along the extending direction which is vertical to the water transferring film for connecting the water transferring film with the paint level.

15 Claims, 10 Drawing Sheets

(56) References Cited

U.S. PATENT DOCUMENTS 10,632,777 B2 * 4/2020 Ikeda .................. B32B 23/08
2013/0280463 A1 * 10/2013 On ........................ B32B 3/10
428/38

* cited by examiner

METHOD FOR MANUFACTURING ELECTRONIC DEVICE

CROSS-REFERENCE TO RELATED APPLICATIONS

This non-provisional application claims priority under 35 U.S.C. § 119(a) on Patent Application No(s). 201810152032.1 filed in China on Feb. 14, 2018, the entire contents of which are hereby incorporated by reference.

BACKGROUND OF THE INVENTION

Technical Field of the Invention

The present disclosure is related to a method for manufacturing an electronic device, and more particularly to a method capable of decorating an appearance of an electronic device.

Description of the Related Art

Current methods for manufacturing an electronic device all assemble two shells together to form a casing for receiving electronic elements. There is obviously a seam connected between the two shells to cause that an electronic device can't have a one-piece appearance for users because the casing is a detachable structure.

Currently, more and more methods trend to decorate wearing devices via using traditional accessories or natural materials, such as woods and/or jades. However, appearances of electronic devices still can't achieve demands of seamless and imitate natural materials because casings of electronic devices are detachable structures and limitations of assembling electronic devices.

In view of the foregoing situations, there is indeed a need for an improved method for making electronic devices, which can improve above shortcomings.

SUMMARY OF THE INVENTION

The present disclosure provides a method for manufacturing an electronic device, the method is capable of maintaining original functions of the electronic device and makes that a color and grains of the electronic device are similar to a color and grains of a natural material.

In one embodiment of the present disclosure, a method for manufacturing an electronic device is disclosed. In the method, a first shell and a second shell are formed. The first shell and the second shell are assembled with each other to form a casing for receiving an electronic module. The two opposite ends of the casing respectively have a first opening and a second opening. The first opening and the second opening are aligned with each other along an extending direction. A seam is located at an outer surface of the casing and between the first shell and the second shell. A paint level is formed on the outer surface of the casing to cover the seam. The casing is moved toward a water transferring film along the extending direction which is vertical to the water transferring film for connecting the water transferring film with the paint level.

The method of the present disclosure is capable of maintaining original functions of the electronic device, the paint level is formed on the casing to cover the seam between the two shells and the water transferring film is connected with the casing, which make the appearance of the electronic device imitates an appearance of a natural material.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein:

FIG. 2 (f) is a schematic view of connecting the water transferring film with a paint level based on FIG. 1;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
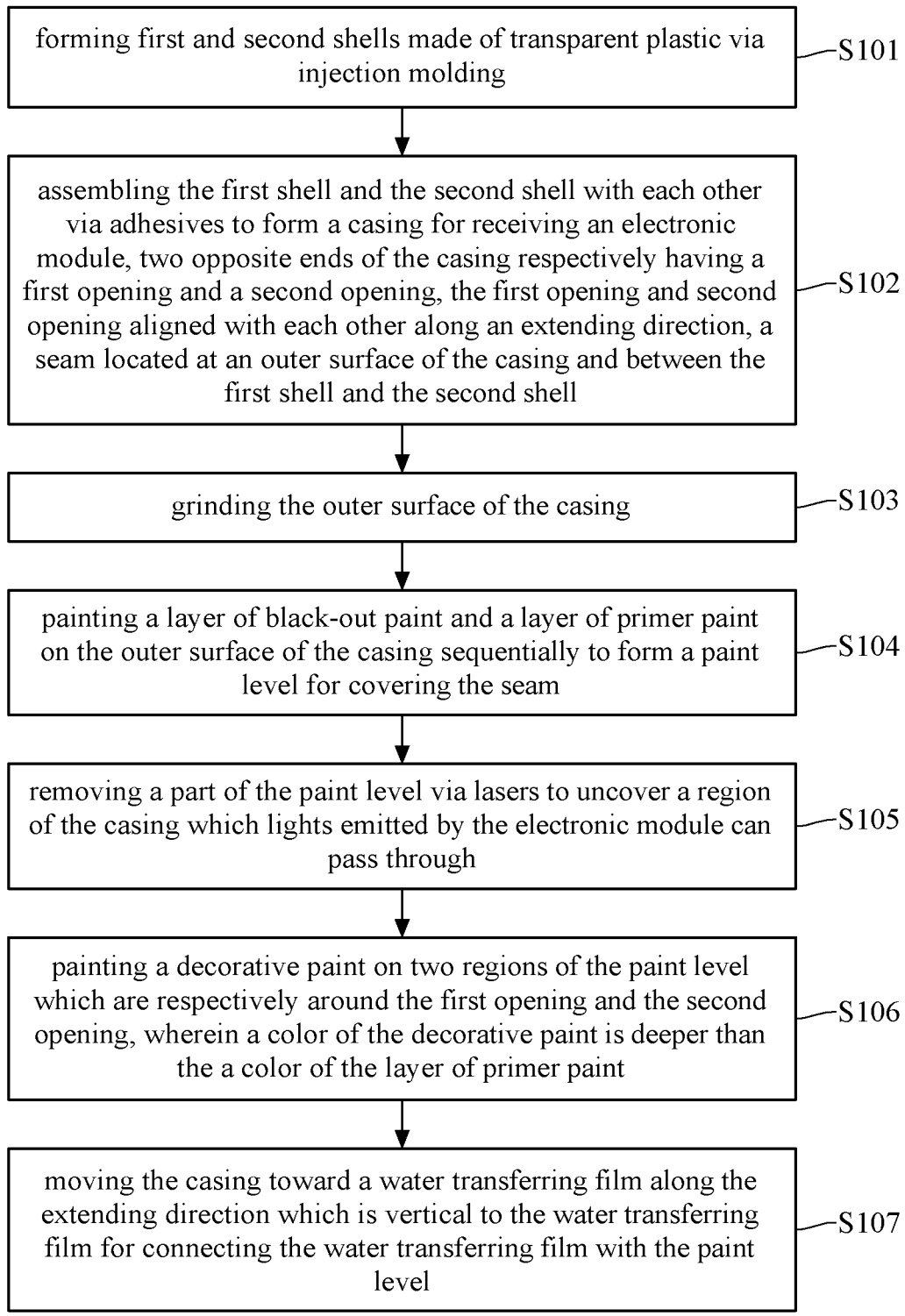
FIG. 1 is a flow chart of a method for manufacturing an electronic device according to the first embodiment of the present disclosure.

Please refer to FIG. 1, which is a flow chart of a method for manufacturing an electronic device according to the first embodiment of the present disclosure. As shown in FIG. 1, Step 101 is forming a first shell and a second shell made of transparent plastic via injection molding. Step 102 is assembling the first shell and the second shell with each other via adhesives to form a casing for receiving an electronic module, two opposite ends of the casing respectively having a first opening and a second opening, the first opening and second opening aligned with each other along an extending direction, a seam located at an outer surface of the casing and between the first shell and the second shell. Step 103 is grinding the outer surface of the casing. Step 104 is painting a layer of black-out paint and a layer of primer paint on the outer surface of the casing sequentially to form a paint level for covering the seam. Step 105 is removing a part of the paint level via lasers to uncover a region of the casing which lights emitted by the electronic module can pass through. Step 106 is painting a decorative paint around the first opening and the second opening, wherein a color of the decorative paint is deeper than a color of the layer of primer paint. In this embodiment, a material of the layer of black-out layer is a black paint, a material of the layer of primer paint is a wood paint whose color is similar to a real wood (such as Thuja or Rosewood), and a material of the decorative paint is a wood paint whose color is deeper than the color of the layer of primer paint. Step 107 is moving the casing toward a water transferring film along the extending direction which is vertical to the water transferring film for connecting the water transferring film with the paint level.

Figure 2A:
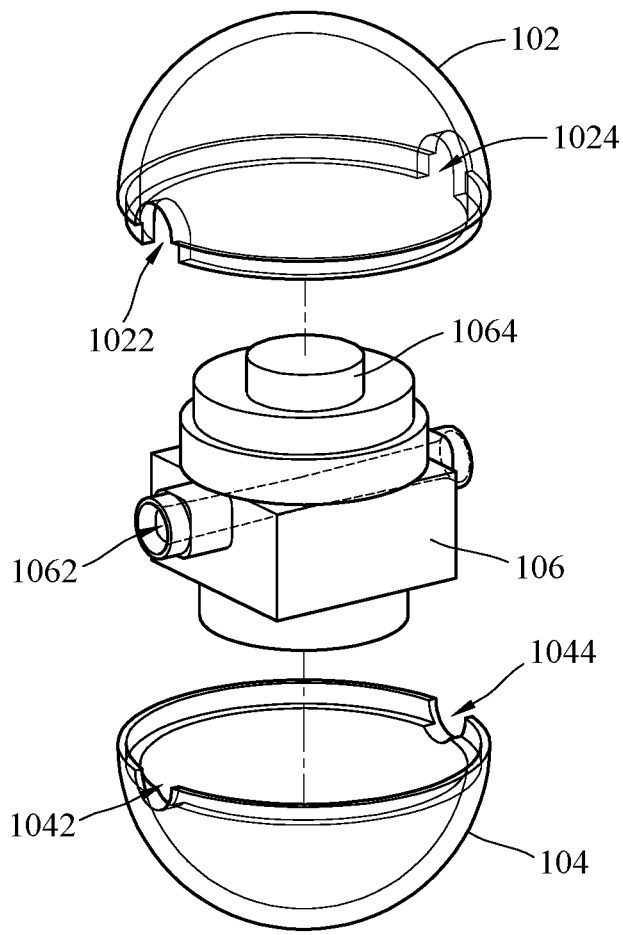
FIG. 2(a) is a schematic view of assembling a first shell and a second shell with each other to form a casing for receiving an electronic module based on FIG. 1.

In conjunction with FIG. 1, FIG. 2(a) is a schematic view of assembling a first shell and a second shell with each other to form a casing for receiving an electronic module based on FIG. 1. As shown in FIG. 2(a), left and right ends of a first shell 102 respective have a first groove 1022 and a second groove 1024, and the left and right ends of a second shell 104 respectively have a third groove 1042 and a fourth groove 1044. The location of the first groove 1022 corresponds to the location of the third groove 1042, and the location of the second groove 1024 corresponds to the location of the fourth groove 1044. An electronic module 106 is disposed between the first shell 102 and the second shell 104, the electronic module 106 has a channel 1062 and a light source 1064, and the light source 1064 can be exemplary a light-emitting diode.

Figures 2B, 2C:
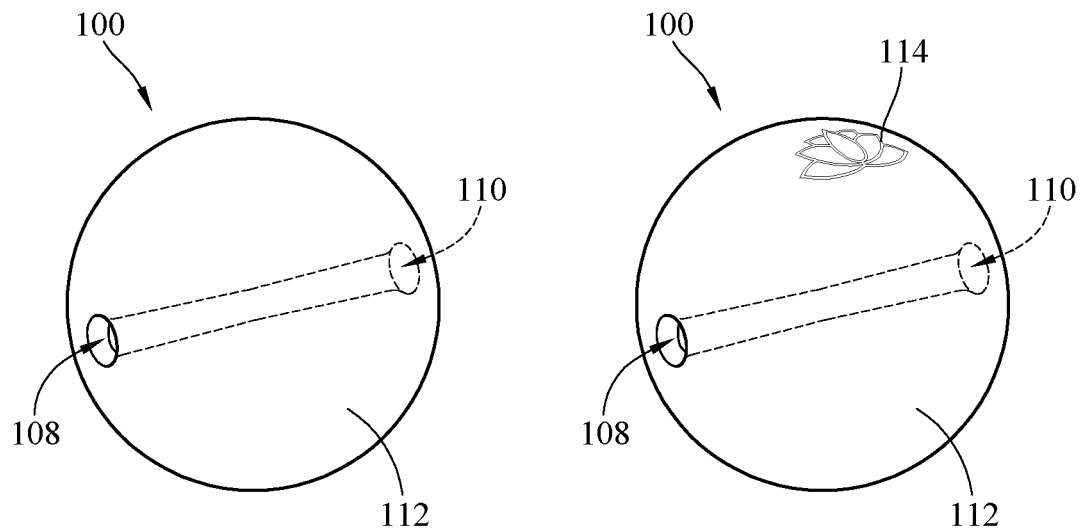
FIG. 2(b) is a schematic view of grinding an outer surface of a casing and forming a paint level on an outer surface of the casing based on FIG. 1.
FIG. 2(c) is a schematic view of removing a part of a paint level via lasers to uncover a region of a casing based on FIG. 1.
Figure 2D:
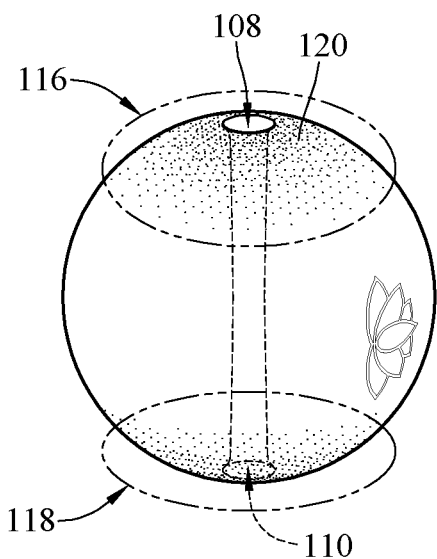
FIG. 2 (d) is a schematic view of painting a decorative paint on a paint level based on FIG. 1.
FIG. 2(e) is a schematic view of a water transferring process implemented on a casing based on FIG. 1.

In conjunction with FIG. 1 and FIG. 2(a), FIG. 2(b) is a schematic view of grinding an outer surface of a casing and forming a paint level on an outer surface of the casing based on FIG. 1. As shown in FIG. 2(b), after the first shell 102 and the second shell 104 are assembled with each other via adhesives to form the casing 100, the first groove 1022 of the first shell 102 is connected with the third groove 1042 of the second shell 104 to form a first opening 108 which is located at the left end of the casing 100, and the second groove 1024 of the first shell 102 is connected with the fourth groove 1044 of the second shell 104 to form a second opening 110 which is located at the right end of the casing 100, and the first opening 108 and the second opening 110 are aligned with each other along an extending direction. The channel 1062 of the electronic module 106 can be exemplary a straight channel or a curved channel, and only the left and the right ends of the channel 1062 are respectively aligned with the first opening 108 and the second opening 110. As shown in FIG. 2(b), after an outer surface of the casing 100 is grinded and a paint level 112 is painted on the outer surface of the casing 100, a seam which is located at the outer surface of the casing 100 and between the first shell 102 and the second shell 104 can be completely covered by the paint level 112.

In conjunction with FIG. 1 and FIG. 2(b), FIG. 2(c) is a schematic view of removing a part of a paint level via lasers to uncover a region of a casing based on FIG. 1. As shown in FIG. 2(c), a part of the paint level 112 is removed to uncover a first region 114 of the casing 100, and the light source 1064 of the electronic module 106 faces the first region 114 of the casing 100. When the light source 1064 is enabled, lights emitted by the light source 1064 can pass through the first region 114 to indicate an operation state of the electronic module 106.

In conjunction with FIG. 1, FIG. 2 (d) is a schematic view of painting a decorative paint on a casing based on FIG. 1. As shown in FIG. 2(d), a decorative paint 120 is respectively painted on a second region 116 and a third region 118 of the paint level 112 which are respectively around the first opening 108 and the second opening 110, and a color of the decorative paint 120 is deeper than a color of the paint level 112, which imitates a color of a real wood and grains of a real wood.

Figure 2E:
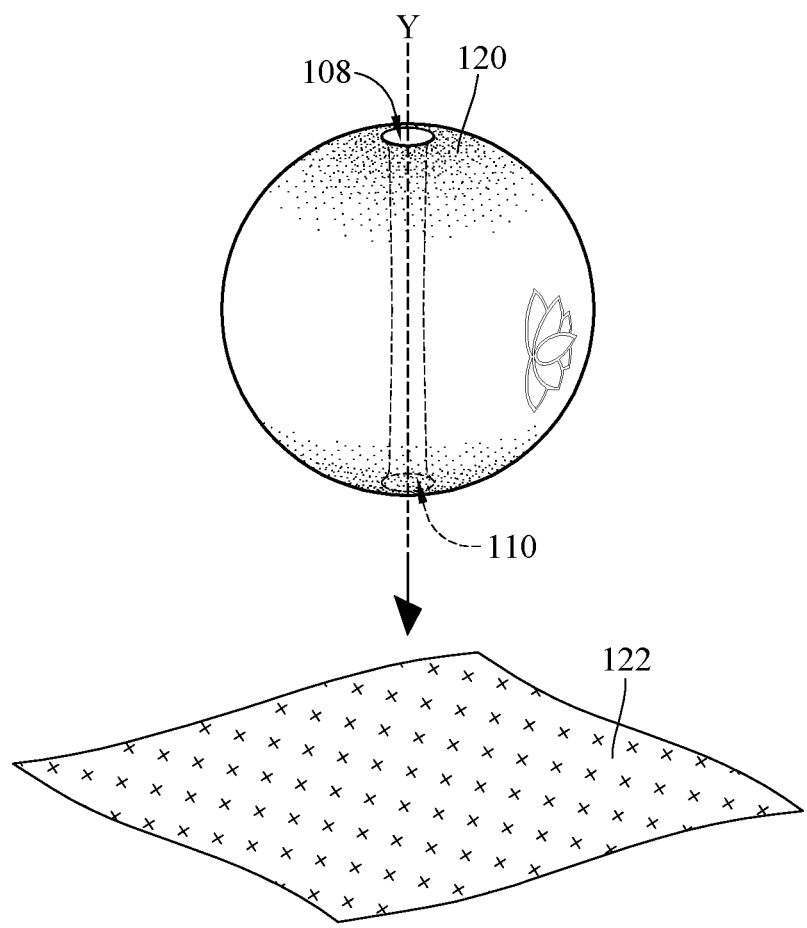
Figure 2F:
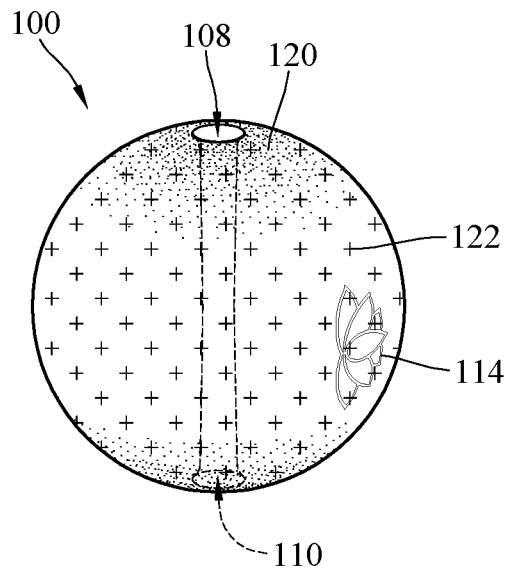

In conjunction with FIG. 1, FIG. 2(e) is a schematic view of a water transferring process implemented on a casing based on FIG. 1. As shown in FIG. 2(e), the first opening 108 and the second opening 110 of the casing 100 are aligned with each other along an extending direction Y, and the extending direction Y is vertical to the water transferring film 122. The casing 100 is moved toward the water transferring film 122, which makes that the paint level 112 is connected with the water transferring film 122.

In conjunction with FIG. 1, FIG. 2 (f) is a schematic view of connecting a water transferring film with a paint level based on FIG. 1. As shown in FIG. 2(f), grains of the water transferring film 122 are similar to grains of a real wood. After the water transferring film 122 is connected with the paint level 112, the paint level 112 of the casing 100 has grains which are similar to grains of a real wood.

Figure 3A:
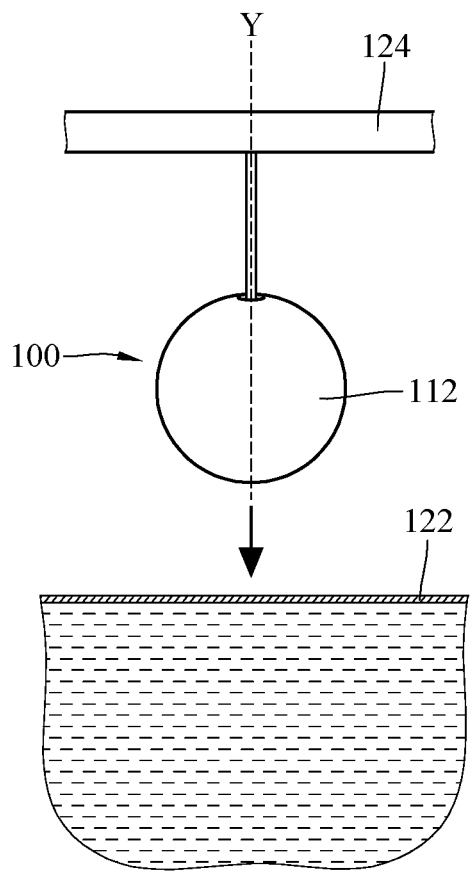
FIGS. 3 (a) to 3(d) illustrate steps of a water transferring process implemented on a casing.
Figure 3B:
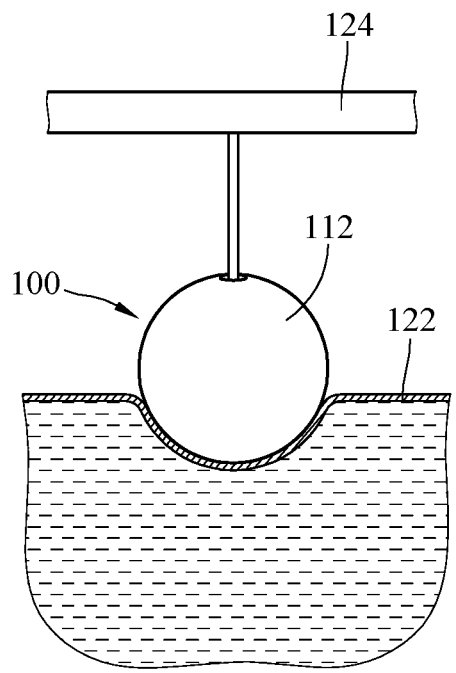
Figure 3C:
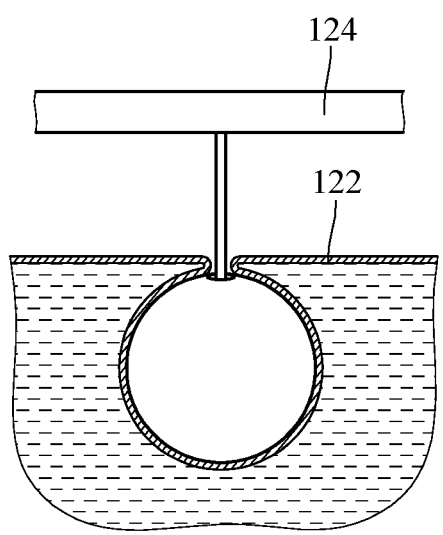
Figure 3D:
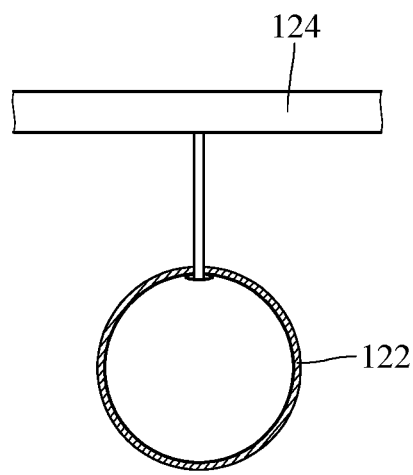

FIGS. 3(a) to 3(d) illustrate steps of a water transferring process implemented on a casing. As shown in FIG. 3(a), a fixture 124 is fixed with the casing 100 via the first opening 108 or the second opening 110, and the extending direction Y of the first opening 108 (or the second opening 110) is vertical to the water transferring film 122 floated on water. As shown in FIG. 3(b), the fixture 124 drives the casing 100 to move downward toward the water transferring film 122, which makes that the casing 100 is connected with the water transferring film 122. As shown in FIG. 3(c), the casing 100 completely enters into water to connect with the water transferring film 122. As shown in FIG. 3(d), the fixture 124 drives the casing 100 to move upward, which makes that the casing 100 completely leaves from water.

Figure 4:
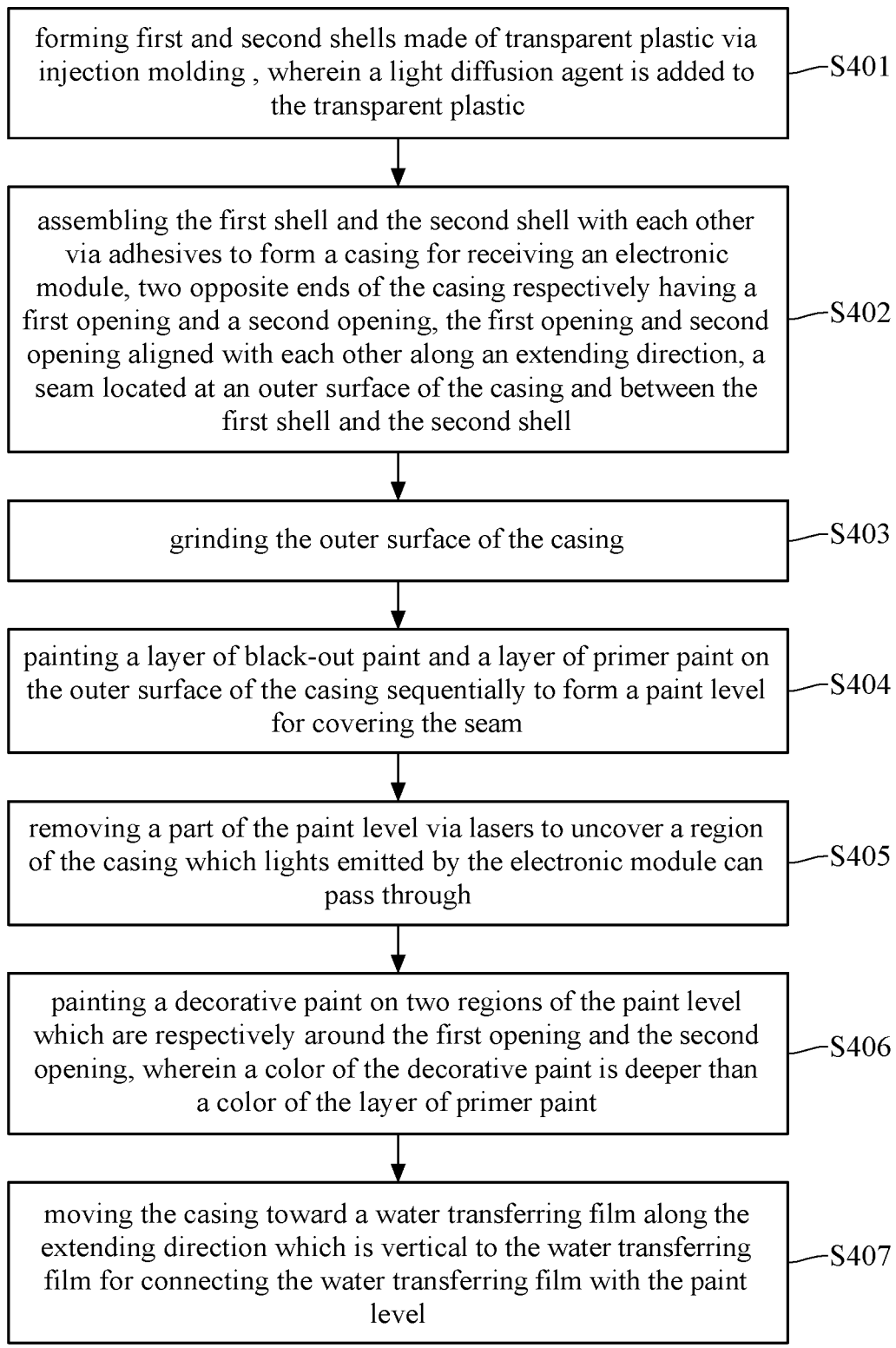
FIG. 4 is a flow chart a method for manufacturing an electronic device according to the second embodiment of the present disclosure.

FIG. 4 is a flow chart a method for manufacturing an electronic device according to the second embodiment of the present disclosure. As shown in FIG. 4, a difference between the second embodiment and the first embodiment is that a light diffusion agent is added to the transparent plastic before forming the first shell 102 and second shell 104 made of the transparent plastic via injection molding. Adding the light diffusion agent to the transparent plastic before forming the first shell 102 and second shell 104 made of the transparent plastic via injection molding, which makes that lights passing through the casing 100 are more uniform.

Figure 5:
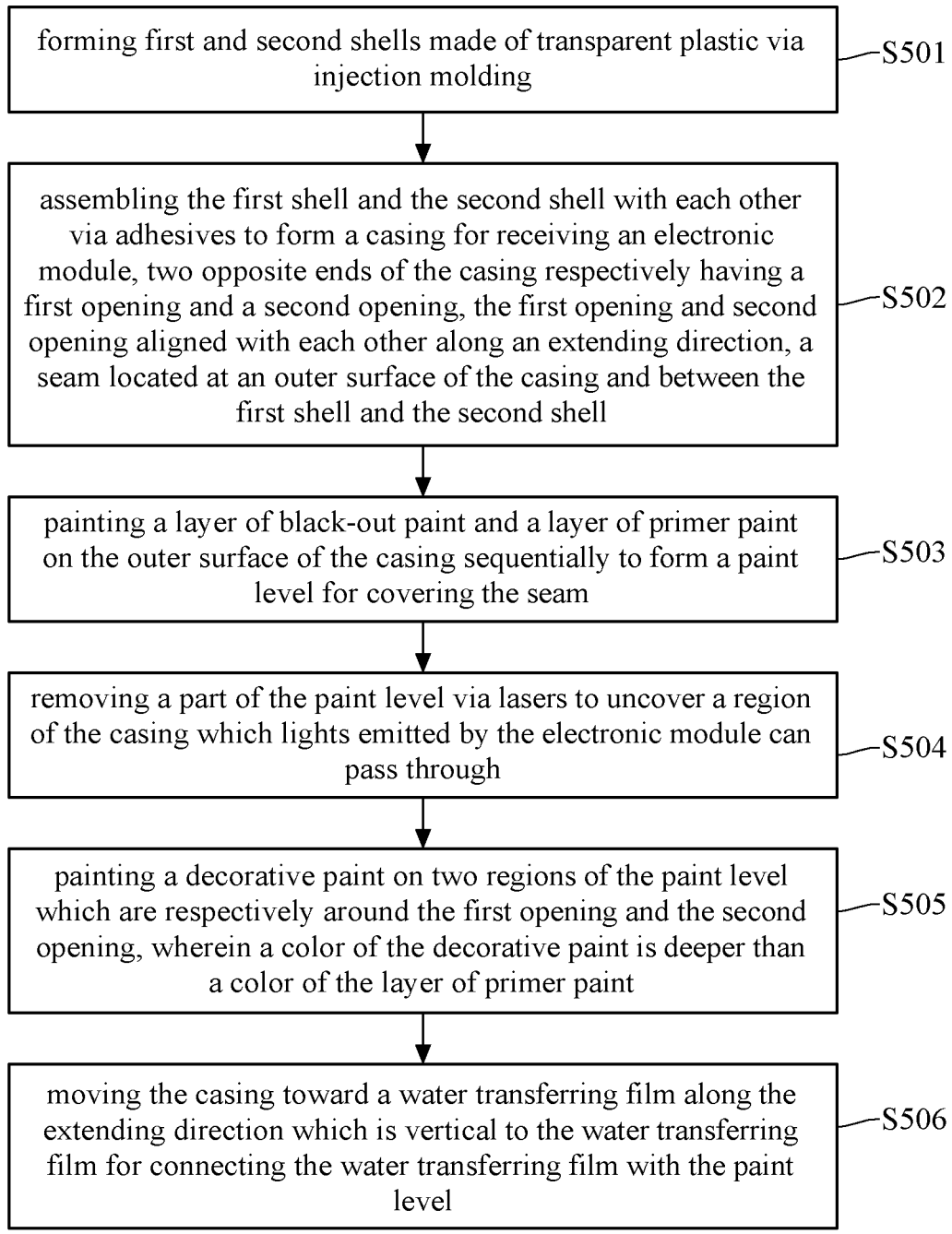
FIG. 5 is a flow chart a method for manufacturing an electronic device according to the third embodiment of the present disclosure.

FIG. 5 is a flow chart a method for manufacturing an electronic device according to the third embodiment of the present disclosure. As shown in FIG. 5, a difference between the third embodiment and the first embodiment is that grinding the outer surface of the casing 100 is omitted.

Figure 6:
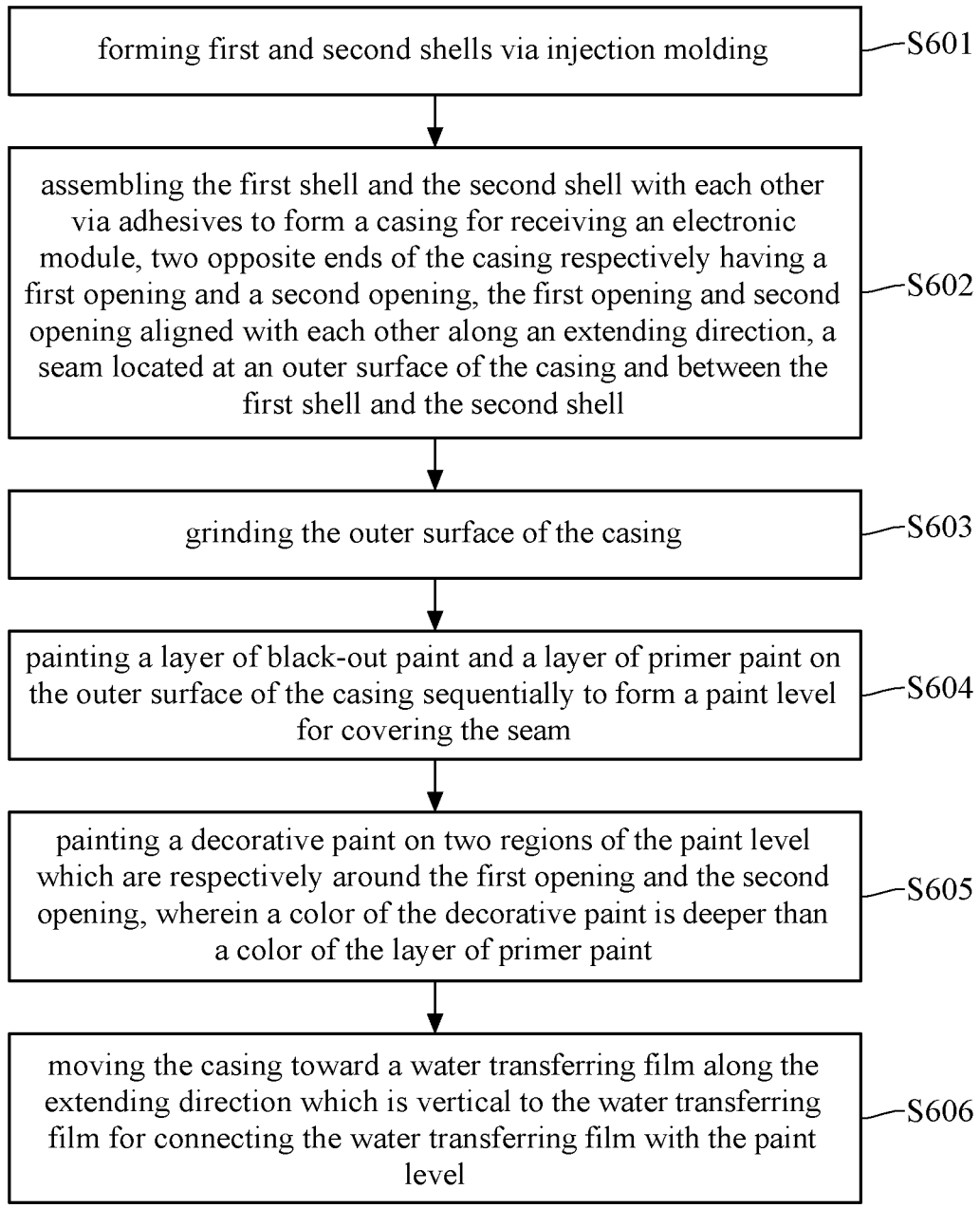
FIG. 6 is a flow chart a method for manufacturing an electronic device according to the fourth embodiment of the present disclosure.

FIG. 6 is a flow chart a method for manufacturing an electronic device according to the fourth embodiment of the present disclosure. As shown in FIG. 6, differences between the fourth embodiment and the first embodiment are that a material of the first shell 102 and a material of the second shell 104 are not limited and removing a part of paint level 112 is omitted. When the electronic module 106 is not provided with the light source 1064, the casing 100 which lights can pass through is not necessary so that forming the casing 100 made of the transparent plastic via injection molding and removing a part of the paint level 112 are not necessary.

Figure 7:
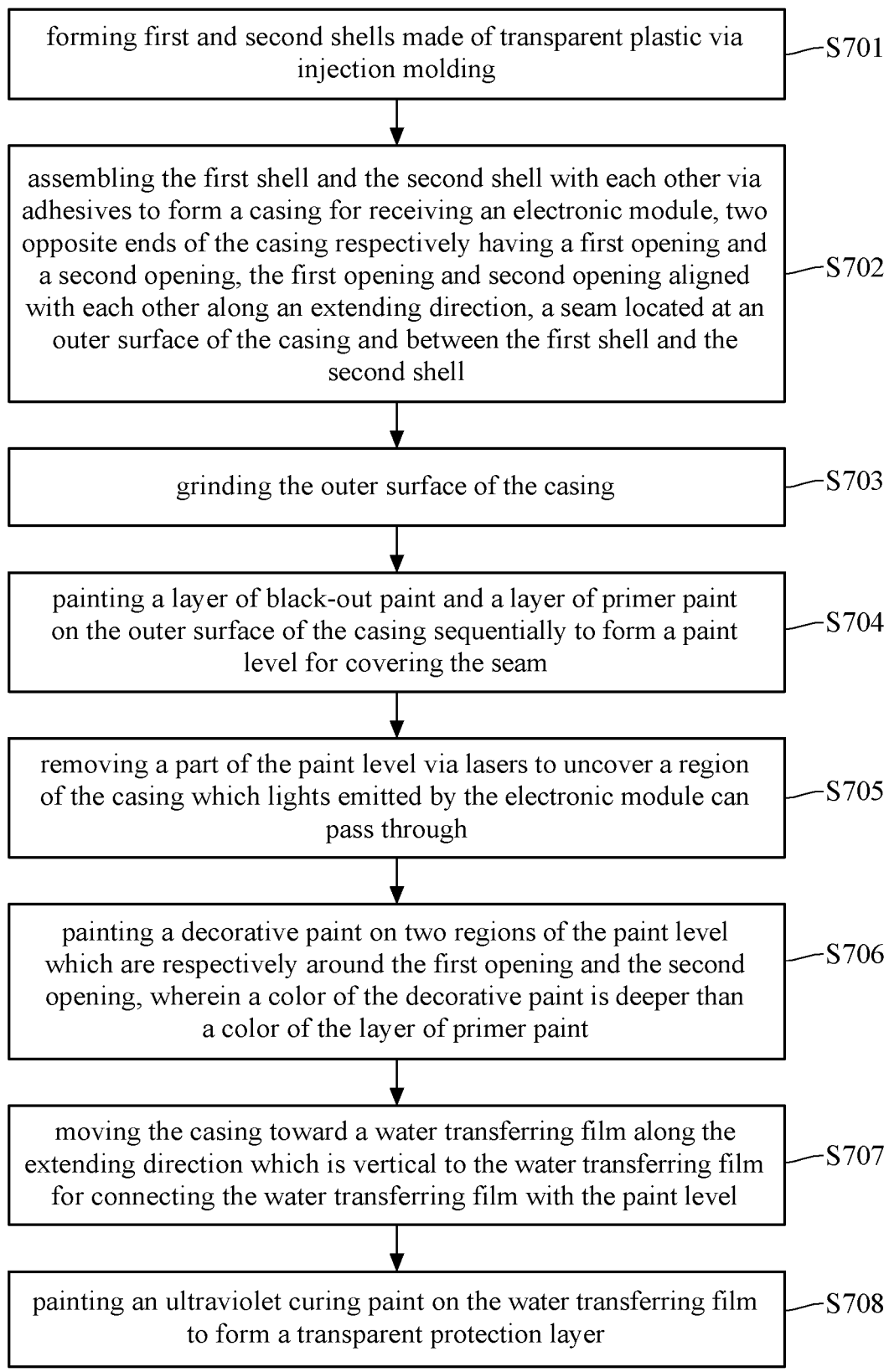
FIG. 7 is a flow chart a method for manufacturing an electronic device according to the fifth embodiment of the present disclosure.

FIG. 7 is a flow chart a method for manufacturing an electronic device according to the fifth embodiment of the present disclosure. As shown in FIG. 7, a difference between the fifth embodiment and the first embodiment is that an ultraviolet curing paint is painted on the water transferring film 112 to form a transparent protection layer for imitating shines of a natural material after the water transferring film 122 is connected with the paint level 112.

Figure 8:
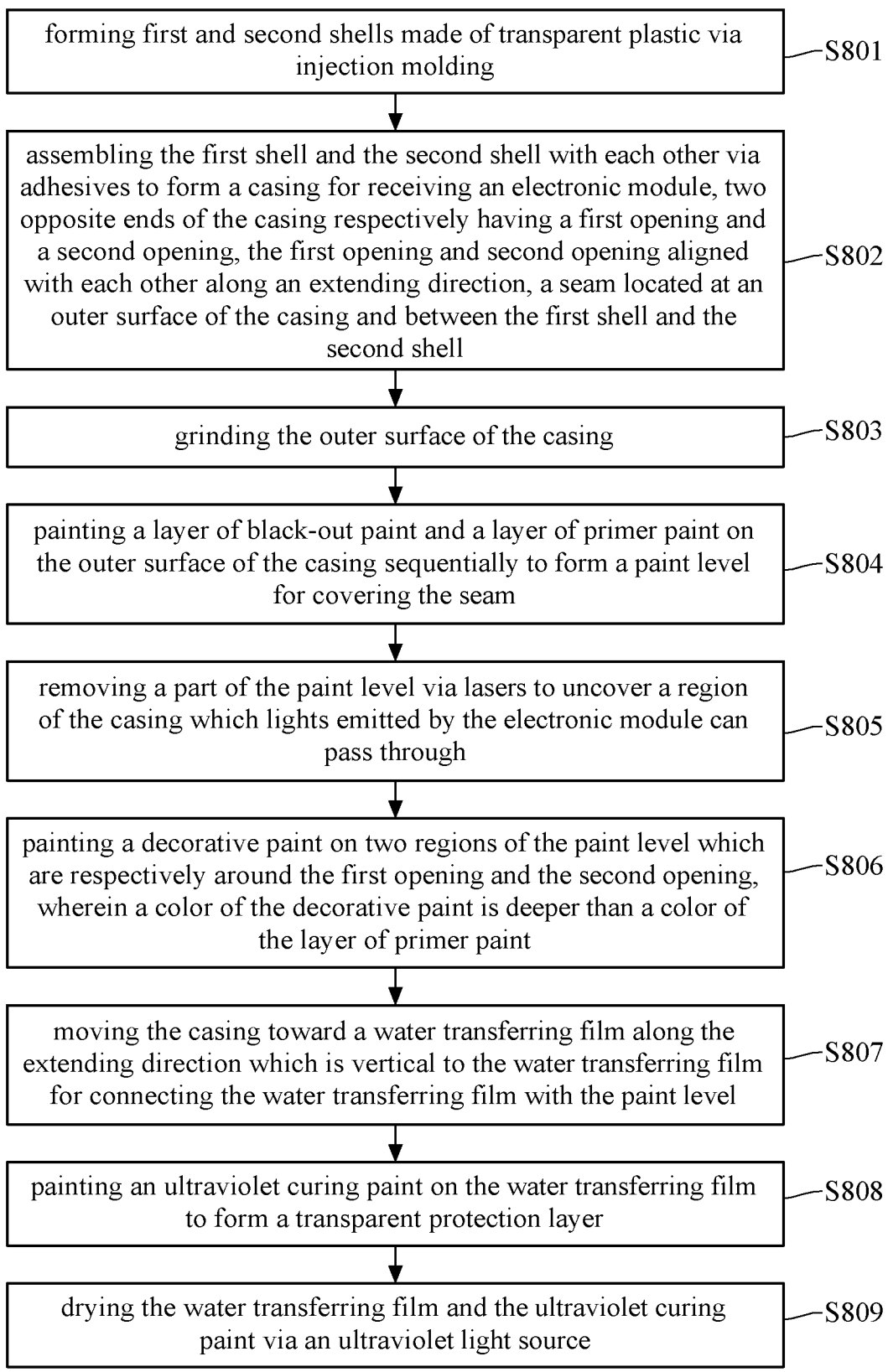
FIG. 8 is a flow chart a method for manufacturing an electronic device according to the sixth embodiment of the present disclosure.

FIG. 8 is a flow chart a method for manufacturing an electronic device according to the sixth embodiment of the present disclosure. As shown in FIG. 8, differences between the sixth embodiment and the first embodiment are that an ultraviolet curing paint is painted on the water transferring film 112 to form a transparent protection layer and an ultraviolet light source is used for drying the water transferring film 112 and the ultraviolet curing paint after the water transferring film 122 is connected with the paint level 112.

In another embodiment, the first shell 102 and the second shell 104 respectively have the first opening 108 and the second opening 108 before the first shell 102 and the second shell 104 are assembled with each other.

In another embodiment, painting the decorative paint 120 is omitted, which makes that the paint level 112 formed on the outer surface of the casing 100 only includes the layer of primer paint.

In another embodiment, the color of the layer of primer paint is similar to a color of a real jade or a color of any one natural material, and the color of the decorative paint is also similar to a color of a real jade or a color of any one natural material. Accordingly, the grains of the water transferring film 122 are similar to grains of a jade or grains of any one natural material.

The shape of the casing made by the method of the present disclosure is not limited, the casing can be exemplary a circular shaped casing or a polygon shaped casing.

In conclusion, the method of the present disclosure is capable of maintaining original functions of the electronic device. Painting the layer of primer paint whose color is similar to a color of any one natural material on the casing, which makes that the seam between the first shell and the second shell is covered by the layer of primer paint. The decorative paint whose color is deeper than the color of the layer of primer paint is painted around the first opening and the second opening, which imitates a gradient color of any natural material. The water transferring process makes the grains of the paint level are similar to grains of any one natural material and makes the appearance of the electronic device imitates an appearance of any one natural material.

What is claimed is:

1. A method for manufacturing an electronic device, comprising:
    forming a first shell and a second shell;
    assembling the first shell and the second shell with each other to form a casing for receiving an electronic module, two opposite ends of the casing respectively having a first opening and a second opening, the first opening and the second opening aligned with each other along an extending direction, a seam located at an outer surface of the casing and between the first shell and the second shell;
    forming a paint level on the outer surface of the casing to cover the seam; and
    moving the casing toward a water transferring film along the extending direction which is vertical to the water transferring film for connecting the water transferring film with the paint level.

2. The method in claim 1, wherein forming the first shell and the second shell comprises: forming the first and second shells made of transparent plastic via injection molding.

3. The method in claim 2, wherein forming the first shell and the second shell further comprises: adding a light diffusion agent to the transparent plastic before forming the first shell and the second shell.

4. The method in claim 1, wherein assembling the first shell and the second shell with each other comprises: assembling the first shell and second shell with each other via adhesives.

5. The method in claim 1, further comprising grinding the outer surface of the casing after forming the casing and before forming the paint level on the outer surface of the casing.

6. The method in claim 1, wherein forming the paint level comprises: painting a layer of black-out paint and a layer of primer paint on the outer surface of the casing sequentially.

7. The method in claim 6, further comprising painting a decorative paint around the first opening and the second opening after forming the paint level on the casing and before moving the casing toward the water transferring film, wherein a color of the decorative paint is deeper than a color of the layer of primer paint.

8. The method in claim 1, wherein forming the paint level comprises: painting a layer of primer paint on the outer surface of the casing.

9. The method in claim 8, further comprising painting a decorative paint around the first opening and the second opening after forming the paint level on the casing and before moving the casing toward the water transferring film, wherein a color of the decorative paint is deeper than a color of the layer of primer paint.

10. The method in claim 1, further comprising removing a part of the paint level to uncover a region of the casing after forming the paint level on the casing and before moving the casing toward the water transferring film.

11. The method in claim 10, wherein the electronic module has a light source, and assembling the first shell and the second shell with each other to form the casing for receiving the electronic module comprises: mounting the light source to face the region of the casing.

12. The method in claim 10, wherein removing the part of the paint level comprises: removing the part of the paint level via lasers.

13. The method in claim 1, wherein the electronic module has a channel, one end of the channel is aligned with the first opening, and the other end of the channel is aligned with the second opening.

14. The method in claim 1, further comprising forming a protection layer on the water transferring film after connecting the water transferring film with the paint level.

15. The method in claim 1, further comprising drying the water transferring film after connecting the water transferring film with the paint level.

* * * * *